United States Patent
Vargo et al.

(10) Patent No.: US 6,356,545 B1
(45) Date of Patent: Mar. 12, 2002

(54) INTERNET TELEPHONE SYSTEM WITH DYNAMICALLY VARYING CODEC

(75) Inventors: Mike Vargo, San Mateo; Jerry Chang, Los Altos, both of CA (US)

(73) Assignee: Clarent Corporation, Redwood City, CA (US)

( * ) Notice: Subject to any disclaimer, the term of this patent is extended or adjusted under 35 U.S.C. 154(b) by 0 days.

(21) Appl. No.: 08/989,361

(22) Filed: Dec. 12, 1997

Related U.S. Application Data

(63) Continuation-in-part of application No. 08/907,686, filed on Aug. 8, 1997, now Pat. No. 6,167,060.

(51) Int. Cl.$^7$ ................................................. H04J 3/22
(52) U.S. Cl. ........................................ 370/355; 370/468
(58) Field of Search ................................. 370/352, 353, 370/354, 355, 356, 465, 468, 474, 477, 401; 704/500, 501, 502, 503, 504

(56) References Cited

U.S. PATENT DOCUMENTS

| | | | | |
|---|---|---|---|---|
| 4,864,562 A | * | 9/1989 | Murakami et al. | 370/538 |
| 5,187,591 A | | 2/1993 | Guy et al. | 358/425 |
| 5,394,473 A | | 2/1995 | Davidson | 381/36 |
| 5,533,004 A | | 7/1996 | Jasper et al. | 370/11 |
| 5,539,908 A | | 7/1996 | Chen et al. | 395/700 |
| 5,555,447 A | | 9/1996 | Kotzin et al. | 455/72 |
| 5,583,652 A | | 12/1996 | Ware | 386/75 |
| 5,617,423 A | * | 4/1997 | Li et al. | 370/426 |
| 5,699,369 A | | 12/1997 | Guha | 371/41 |
| 5,742,773 A | * | 4/1998 | Blomfield-Brown et al. | 709/228 |
| 5,881,234 A | | 3/1999 | Schwob | 395/200.49 |
| 5,890,108 A | | 3/1999 | Yeldener | 704/208 |
| 5,933,803 A | * | 8/1999 | Ojala | 704/223 |
| 5,940,479 A | | 8/1999 | Guy et al. | 379/93.01 |
| 6,026,082 A | * | 2/2000 | Astrin | 370/336 |
| 6,052,391 A | * | 4/2000 | Deutsch et al. | 370/540 |
| 6,064,653 A | * | 5/2000 | Farris | 370/237 |
| 6,130,883 A | * | 10/2000 | Spear et al. | 370/328 |

* cited by examiner

*Primary Examiner*—Kwang B. Yao
(74) *Attorney, Agent, or Firm*—Carr & Ferrell LLP

(57) ABSTRACT

The invention is concerned with improvements in full duplex Internet telephone systems with a system architecture having low latency and permitting voice communication with telephone to telephone or PC to telephone connections. The architecture permits dynamic packet-to-packet change in codec to adjust for Internet conditions. The voice port creates self-describing packet conditions so that the higher level software of the system is independent of codec selection. In addition to adjusting the codec, the voice port has the capability of dynamically and concurrently selecting other factors such as the level of error correction redundancy, the packet size and packet bundling on a packet-to-packet basis. The invention further includes a technique to eliminate dead air spaces in the voice data transmission stream by speeding up or slowing down the data rate in the buffer while maintaining a constant pitch of speech.

26 Claims, 12 Drawing Sheets

(a)

(b)

(c)

(a)

(b)

(c)

(d)

(a)

(b)

(c)

INTERNET TELEPHONE SYSTEM WITH DYNAMICALLY VARYING CODEC

CROSS-REFERENCE TO RELATED APPLICATIONS

This application is a Continuation-in-Part of U.S. patent application Ser. No. 08/907,686, filed Aug. 8, 1997," now U.S. Pat. No. 6,167,060 by Mike Vargo and Jerry Chang, entitled, "Dynamic Forward Error Correction Algorithm for Internet Telephone," which is hereby incorporated by reference.

BACKGROUND OF THE INVENTION

1. Technical Field

The present invention relates generally to an Internet telephone system operating over a Public Switched telephone Network (PSTN), and more specifically to an Internet telephone system with codecs that dynamically change from packet to packet.

2. Discussion of the Prior Art

The idea of sending telephone calls over the Internet is relatively new, brought on by the desire to avoid expensive long distance telephone bills from the major telephone companies. While the concept of sending audio and video data, e.g. cable programming, over the Internet has been known since 1990, it was not until 1993 that a program called Maven was created to transmit voice data using a personal computer. In 1995, VocalTec offered a beta test version of its Windows-based Internet telephone, and that same year DigiPhone offered full duplex Internet telephone system, which allowed users to talk and listen simultaneously.

Several problems must be addressed to make an Internet telephone product commercially successful. One of the most important is maintaining sound quality despite dropouts or gaps caused by the Internet. The digital nature of the Internet has theoretical advantages vis-a-vis analog networks, but when the Internet is busy a caller may have difficulty getting through to another party. Moreover, since the Internet is built to transfer data packets rather than continuous streams of sound, there may be delays and losses.

For a telephone call to be placed over the Internet, the analog voice information must be converted into a digital format as a series of data packets that are communicated through the Internet's web of computers, routers and servers. Data compression algorithms are designed to prevent the customer from noticing delays between packets in the data stream.

Analog voice messages spoken by customers are digitized and then compressed by a compression/decompression ('codec') algorithm. There are at least ten different types of codecs, each designed to compress data optimally for a particular application. Some codecs use audio interpolation to fill in dropouts or gaps. Other codecs create high quality sound, but use complex algorithms that are slower to execute on a given computer. Still other codecs use faster compression algorithms, but the sound quality is not as high. Whether the speed of the compression algorithm is important for a particular application may depend on the speed of the computer executing the algorithm. Different codecs use different compression ratios to compress data. For example, one codec might compress data by a factor of two from 8 kbits/second to 4 kbits/second, while another codec might compress data by a factor of five from 8 kbits/second to 1.65 kbits/second. Codecs exist that have data compression factors of twelve, and even as high as fifty, but these require more complex mathematical algorithms and the resultant sound quality may depend on such things as the frequency and computer connection. Exemplary codecs include GSM, a European standard having a 5:1 compression ratio, and the TrueSpeech codec (of DSP Group, Santa Clara, Calif.) having a 15:1 compression ratio.

Prior art systems typically run only one codec at a time, although the codec may be specified initially by the user through adjustment of the computer settings or through selecting the codec from a file menu. Codec programs at both ends of an exchange must be able to understand each another, so compatibility between codecs may also be an issue.

Codecs do not address data dropouts or loss. Ordinarily, the Internet Protocol uses an Automatic Repeat Request (ARQ) to request retransmissions of lost messages, but voice transmission systems attempt to interpolate lost data rather than resend it.

It is generally known in prior art Internet telephone systems that codecs can be manually selected since both parties must be using the same codec to understand one another. U.S. Pat. No. 5,539,908 to Chen et al discloses a system for dynamically linking codec algorithms between file formats. While Chen et al supports a plurality of existing and future codec installations, codecs are only changed between file formats and not on a packet-to-packet basis.

U.S. Pat. No. 5,394,473 to Davidson discloses a device for coding and decoding of audio signals that optimizes between time and frequency resolution through selection of the coder. However, Davidson is not concerned with an Internet telephone system, nor changing the codec on a packet-to-packet basis.

The television and radio industries employ speech compression techniques in advertisement spots to minimize the amount of advertising time paid for by sponsors. Such techniques speed up the audio data while maintaining a constant pitch or frequency for the voiceover. U.S. Pat. No. 5,583,652 to Ware provides a technique known as time domain harmonic scaling for variable speed playback of an audio/video presentation while keeping the audio and video synchronized as well as the audio pitch undistorted. U.S. Pat. No. 5,555,447 to Kotzin et al mitigates speech loss in a communication system by buffering time-compressed speech in a FIFO until the FIFO is substantially empty. Thereupon, Kotzin et al transitions the communication system from time-compressed to normal speech.

SUMMARY OF THE INVENTION

The present invention sets forth a novel Internet telephone system architecture for providing full duplex operation with low voice latency. The architecture enables a dynamic change of codec from packet to packet in the same voice data stream in order to adapt to changing network conditions. The change of codec operates concurrently with a change in other factors including the level of redundancy of the error correction, the packet size and packet bundling. The architecture thereby seeks to attain the best speech quality and lowest latency given the level of data loss over the Internet detected by the system.

One further feature of the present invention is a technique for eliminating dead air space in the data stream by speeding up or slowing down the data from the buffer while maintaining a constant voice pitch.

DETAILED DESCRIPTION OF THE PREFERRED EMBODIMENTS

Figure 1:
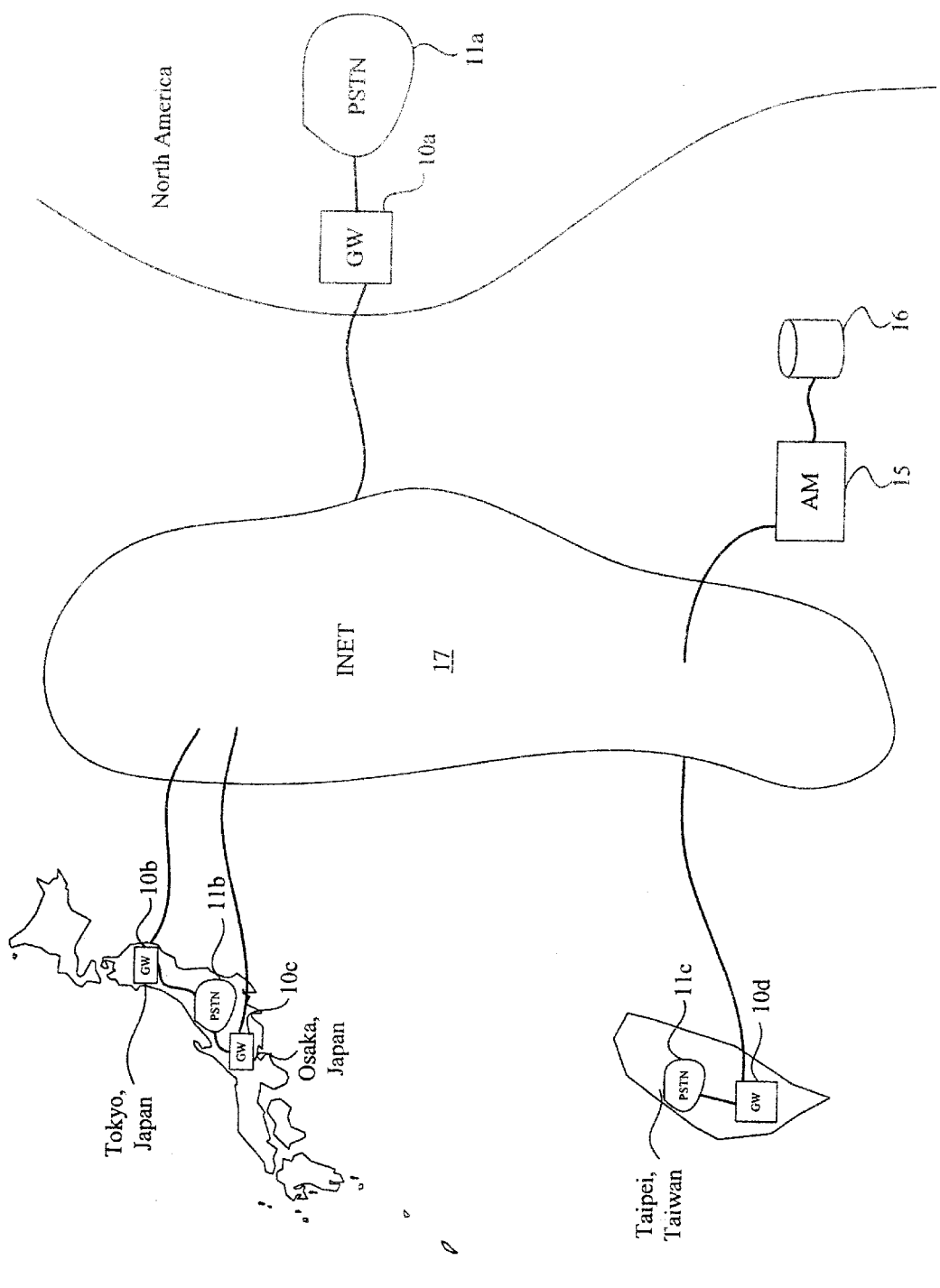
FIG. 1 shows an overview of an Internet telephone system according to the present invention.

FIG. 1 illustrates in general overview the operation of the Internet telephone system of the present invention. A call is initiated in North America over a PSTN gateway server 10a from a PSTN 11a. The server 10a supports either Telephone to Telephone conversations or PC to Telephone connections. FIG. 1 shows possible connections over the Internet 17 to Tokyo Japan, Osaka Japan and Taipei Taiwan. In each of these cities, a PSTN gateway server 10b–d is connected to a PSTN 11a–c and the Internet 17 to receive calls. An account manager (AM) 15 provides billing, monitoring and authentication of these telephone services for up to 25 servers. The account manager 15 interacts with a relational database 16, and is an intelligent network or service control point. The account manager 15 can be attached at any point on the network.

Figure 2:
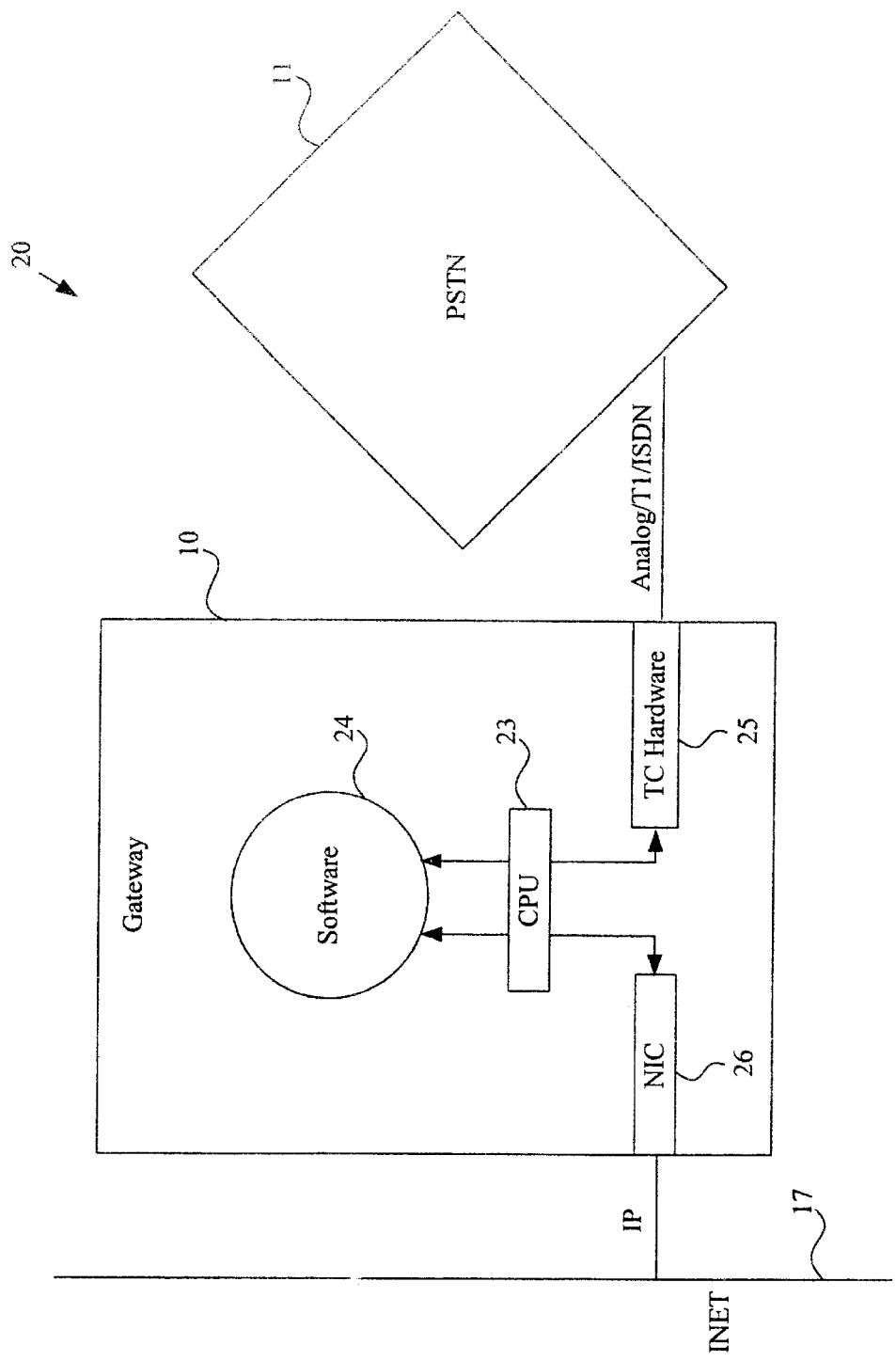
FIG. 2 details the main features of the gateway server of FIG. 1.

Referring to FIG. 2, each of the PSTN gateway servers 20 consists of a Public Switched Telephone Network 11 and a gateway server 10. Each gateway 10 consists of a central processing unit (CPU) 23, the Windows® Operating System (OS) (not shown), gateway software 24, telecommunications hardware (preferably G.723.1 TRAU from Natural Microsystems of Framingham, Mass.) 25 and a Network Interface Card (NIC) 26 connected by a bus. The gateway operates on a "Wintel" platform, preferably with Windows NT 4.0. The telecommunications hardware 25 supports analog, T1 or Integrated Services Digital Network (ISDN) connections to the PSTN 11, and the NIC 26 supports an Internet Protocol (IP) such as TCP (Transmission Control Protocol) or UDP (User Datagram Protocol) connection to the Internet 17.

Figure 3:
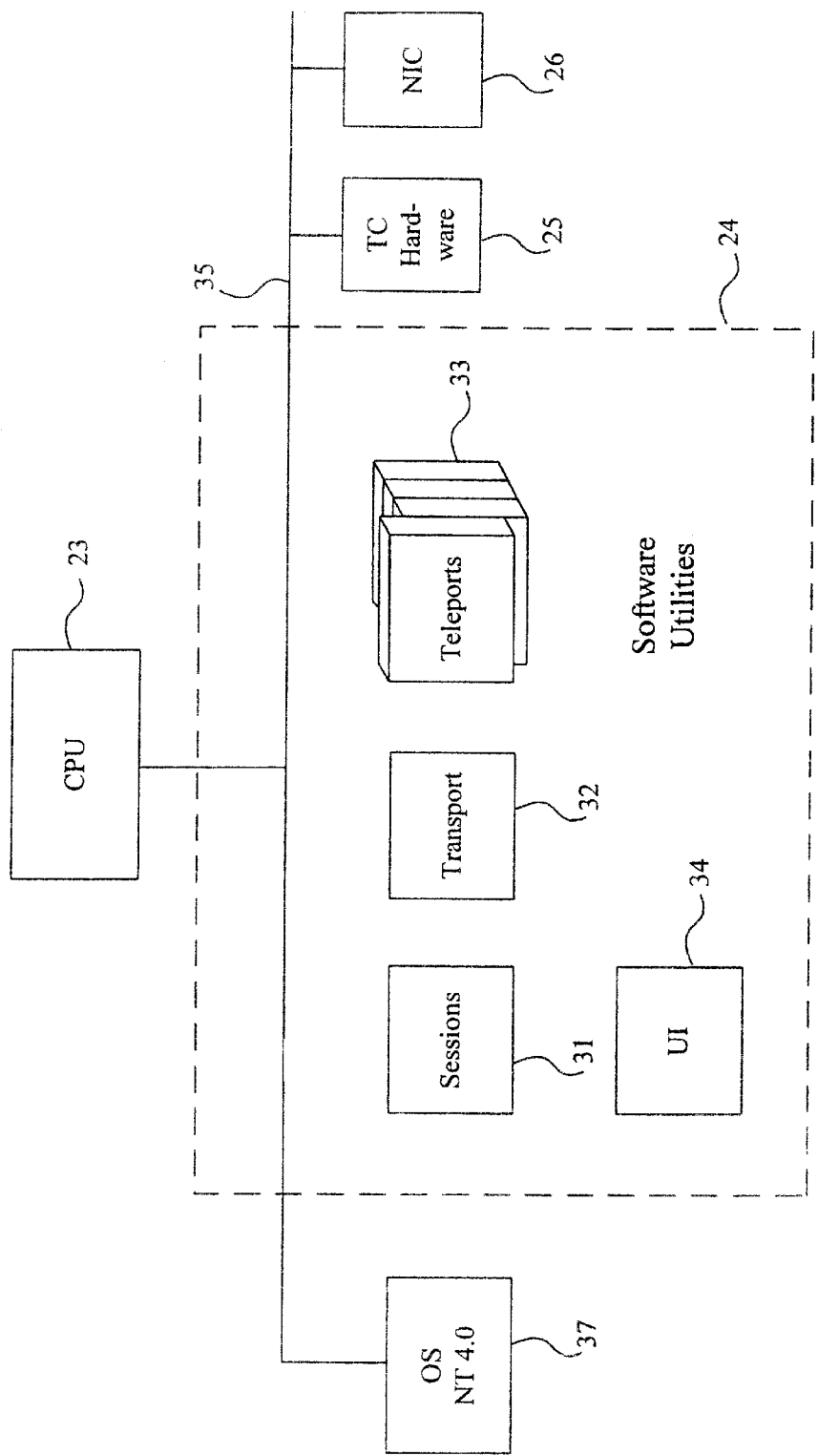
FIG. 3 shows gateway server features in more detail, with an emphasis on the software modules.

FIG. 3 shows the gateway server software utilities 24 which include modules called sessions 31, transport 32, a plurality of teleports 33 and a User Interface (UI) 34. A bus 35 connects software utilities 24 to CPU 23, the Windows® NT 4.0 Operating System 37, the telecommunications hardware 25 and the NIC 26.

Figure 4:
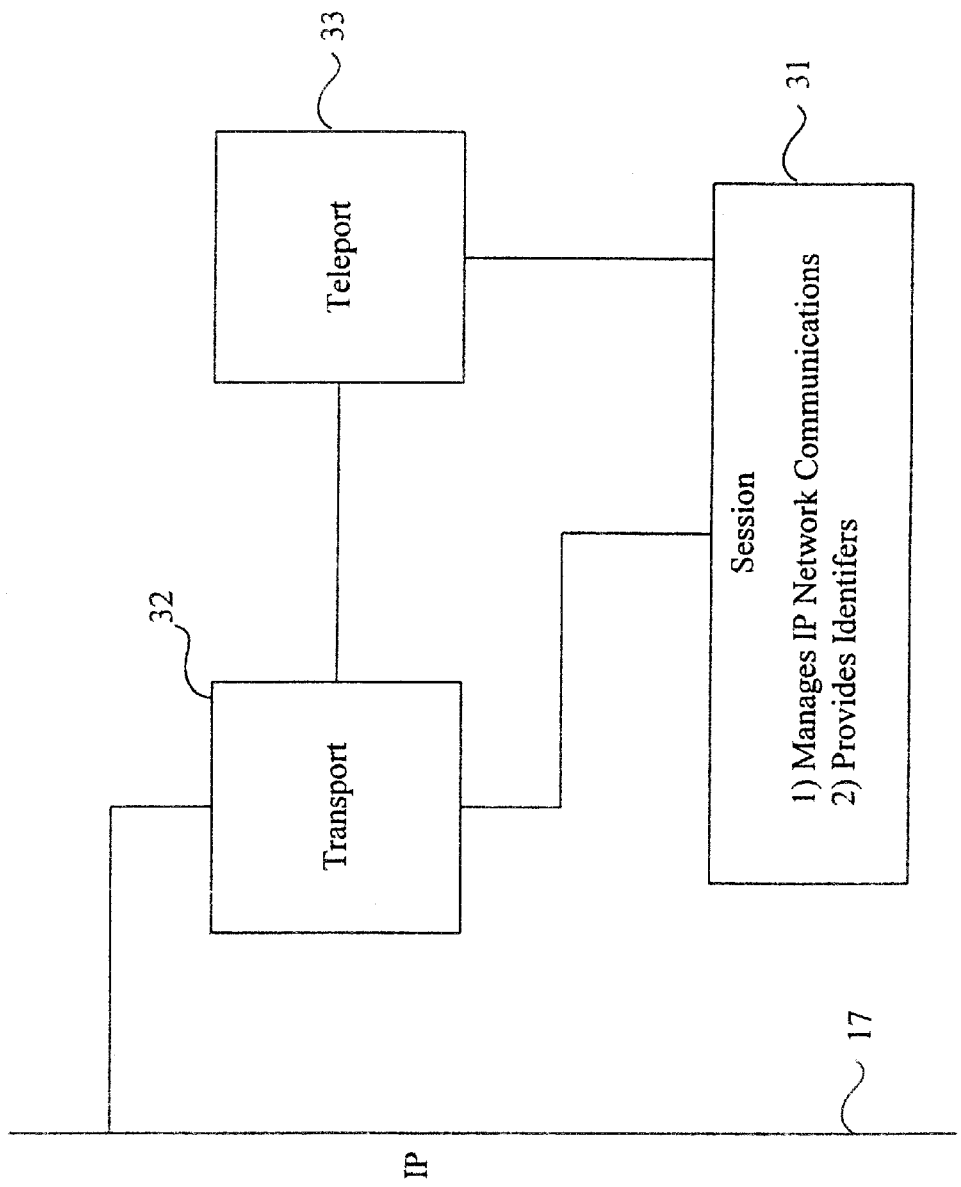
FIG. 4 shows the operation of these software modules in relationship to establishing a call connection.

FIG. 4 illustrates the transport 32 receiving a call from the Internet 17, and creating a session 31 to join the call to the teleport 33. Turning now to a general description of how the FIGS. 2, 3 and 4 gateway server 10 operates, assume there is a call incoming from the PSTN 11. This incoming call signals its arrival to the software 24 of the gateway server 10. Associated with each audio port of the gateway server 10 is an object port, called a telephone port, or teleport 33, FIG. 4, that waits for an incoming call. On the Internet side of the gateway 10, there is another object called the transport 32. Between the teleports 33 and the transport 32 is an object called the sessions 31, which joins the ports on one gateway to ports on another gateway. The session 31 is the communication mechanism between teleports 33, and has two functions: (1) managing IP network communication between the incoming and outgoing ends of the server, and (2) providing labeling and identifiers to indicate the conversation endpoint. The sessions 31 finds an available connection such that an incoming call from the telephone line 11 is joined to an outgoing message on the Internet 17. Similarly, if an incoming call arrives from the Internet 17, this call is received by the transport 32 at the ingress side of the server and the session 31 links this call on the egress side to a teleport 33 to produce an outgoing call on the PSTN 11.

The gateway server 10 has various software objects associated with the teleports 33 and the transport 32. For example, a teleport 33 has an echo suppressor for voice data and also an encapsulating algorithm, to be discussed below. The transport 32 contains similar software for data filtering and correction.

Figure 5:
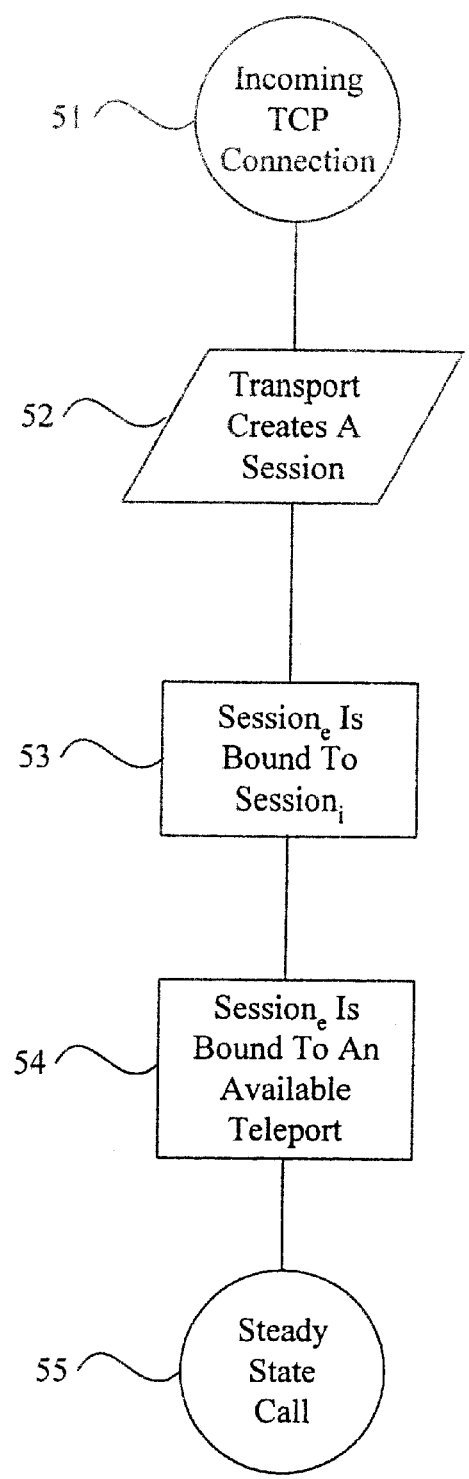
FIG. 5 is a flowchart of steps in connecting a call.

FIG. 5 shows a flowchart of the gateway software process for handling an outgoing (egress) call setup to illustrate the operation of the transport. Beginning in step 51, an incoming call is input to the transport 32, which listens for incoming TCP connections. In step 52, the transport 32 creates an incoming session 31, $session_i$, and in step 53, this session 31 is bound to an outgoing or egress session 31, $session_e$, on the remote side of the gateway 10. Then, in step 54, $session_e$ is bound to an available telephone port 33 on the outbound side of the server 10. Step 55 indicates a steady state condition where the call has been set up with a pair of ports talking to one another.

The gateway server of the present invention supports both telephone to telephone conversations as well as PC to telephone conversations. Each server can accommodate up to 24 simultaneous conversations. High quality voice communication is established with low latency. The Gateway system includes 10 Base T or 100 Base T network connections, and has the ability to capture Dual Tone Multifrequency (DTMF) tones from end users.

The teleport supports up to 16 different varieties of codec algorithms for speech. A codec is a hardware or software mechanism for converting analog voice signals to digital signals and encoding the digital signals, and vice-versa. The teleport is designed to be able to switch codecs between one data packet and the next in the same data stream. Each data packet is a self-describing package.

Figure 6:
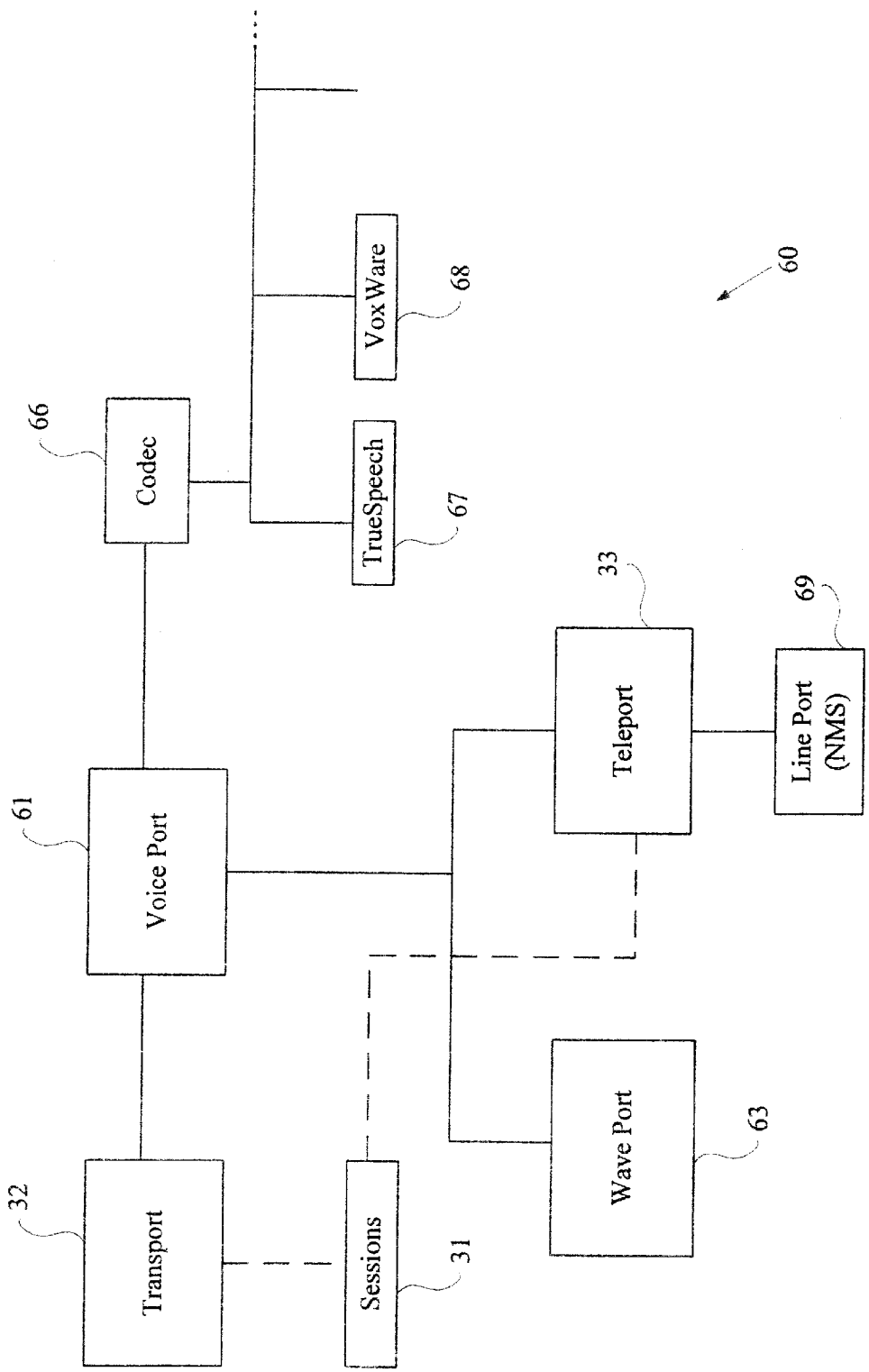
FIG. 6 shows the software modules of the gateway server in further detail.

FIG. 6 is a system architectural diagram 60 of FIG. 4 in further detail. The voice port 61 receives incoming data packets from the transport 32. Each transport 32 has many voice ports 61. The voice port 61 has derived classes of the wave port 63, which contains multimedia Application Program Interfaces (API's), and the teleport 33. Teleport 33 is connected to the PSTN through the line port 69 and to transport 32 by the sessions 31. The voice port 61 contains the codec algorithms 66. Among the different varieties of codec are the TrueSpeech algorithm 67, Voxware 68, the null speech algorithm and others.

The voice port 61 is responsible for three functions. First, it provides forward error correction. Second, it provides an algorithm for sending and regenerating speech. And third, it provides for alignment and framing of data packets within the buffer.

Figure 7A:
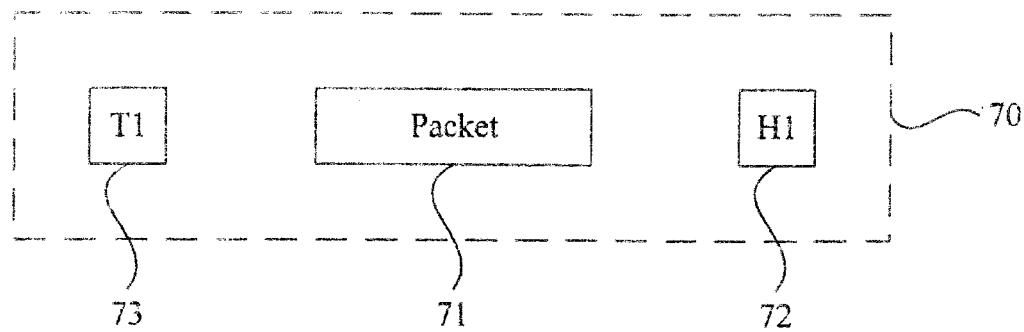
FIGS. 7(a) and 7(b) show the relationship between data packets and frames.
Figure 7B:
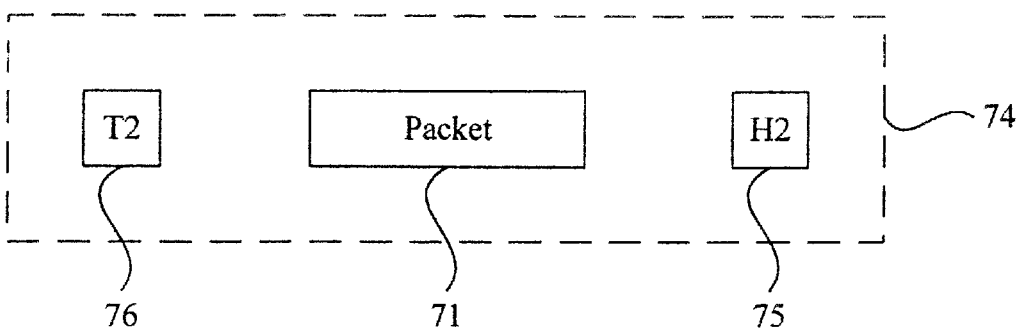

A data packet is contained within a frame, as shown in FIGS. 7(a) and 7(b), and each layer of the network adds some special formatting to the data packet within the frame. Frame A (70) consists of packet 71 plus header 72 and trailer 73 information fields, H1 and T1, where header H1 (72) and trailer fields T1 (73) are specific to the particular network link. The data packet 71 remains the same between network links, but is framed differently depending upon the network link. For another network link, the data packet 70 is framed in Frame B (74) with headers 75 and trailers 76, H2 and T2. The process by which the network link substitutes its own headers 72, 75 and trailers 73, 76 as the protocol for the data packet 71 is called encapsulation.

Generally, a given message is not sent as a continuous stream of information, but is broken up into blocks of data packets having variable lengths. The process by which a network link breaks up the data into packets is called segmentation, and the process by which the packets are put back together into a message at the receiving end is called reassembly. There are a variety of reasons for segmenting a message. First, a given network link only accepts messages up to some fixed length. Second, errors are more readily controlled, since it is not necessary to retransmit the entire message if there is an error in only part of the message. An error becomes more likely as the length of the message increases. Third, the network is shared more equitably, and one message does not monopolize the network, when the messages are segmented.

One feature of the present invention is a forward error correction algorithm for providing packet redundancy. The basic problem is how to correct for certain packets of voice information being lost as they are transported across the Internet. Prior art approaches used interpolation to deal with lost packets. In the present invention, lost data packets can be recovered because these packets are duplicated downstream in the data field.

Packet redundancy effectively slows the data transmission rate because, due to replication, the information density is not as high. A packet with a redundancy of level one is twice as long as a packet with a redundancy of level zero, and a packet with a redundancy of level two is three times as long as a packet with a redundancy of level zero. Changing the packet redundancy has some similarity to changing the packet size or packet bundling, since the overall data stream has a different length than before. But while changing the packet size or bundling puts more information in each packet, changing the packet redundancy does not. Still, even at the expense of transmission capacity, it is advantageous to provide redundancy in the data stream to eliminate voice nulls due to lost data or dropouts and thereby improve voice quality. Thus, a certain amount of transmission delay is sacrificed for the overall success and integrity of the voice transmission.

The level of data redundancy for the error correction algorithm of the invention is between zero and three. That is, the data is replicated in zero to three subsequent packets of the message. The data stream of the message is sequenced, and it is important to keep the sequence intact. When the forward error algorithm is enabled, each data packet of the speech segment is compared to the previous data packet in the speech segment packet to determine whether there is a voice null or gap in the sequence. In the limiting case where the error correction algorithm is not enabled, the level of redundancy is zero. If the error correction algorithm is enabled and a voice null or gap is detected in the sequence, then the algorithm regenerates the lost packet through comparing the sequence numbers of the received packets for redundant data.

As a general principle, the three level fault tolerance is designed for marginal networks and can accommodate up to four consecutive dropped packets. The number of dropped packets varies according to a Poisson or similar type of statistical distribution (e.g. Pareto), with the majority of consecutive packet losses being in the range of one to four, with few consecutive packet losses in the tails of the distribution, i.e. numbering more than four consecutive losses.

Figure 8:
FIGS. 8(a) to (d) illustrate the operation of the forward error correction algorithm of the present invention.
Figure 8:
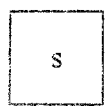
Figure 8:
Figure 8:
Figure 8:
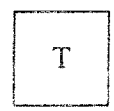
Figure 8:
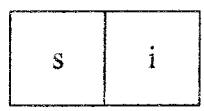
Figure 8:
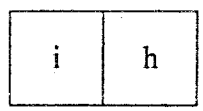
Figure 8:
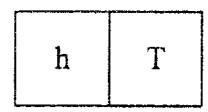
Figure 8:
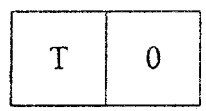
Figure 8:
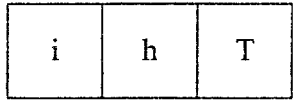
Figure 8:
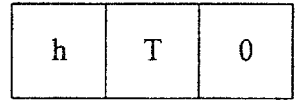
Figure 8:
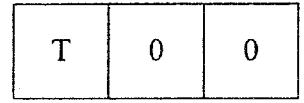
Figure 8:
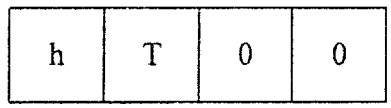
Figure 8:
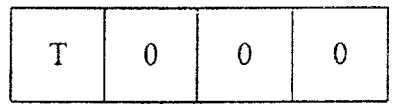

The particular error correction algorithm of the invention is described in FIGS. 8(a) to 8(d). In these examples, each box is assumed to be essentially one data packet, but for purposes of illustration each of these packets is illustrated as a letter of the alphabet. The grouping of data packets in pairs, triplets or quadruplets in FIGS. 8(a) to 8(d) is for purposes of illustration only; the data stream is continuous without spaces between the groupings. In FIG. 8(a), the data stream is illustrated as "This is a sentence." The data stream is propagating from left to right in the drawing, so that the "T" comes first, then the "h," then the "i," et cetera.

FIG. 8(b) shows the encoding scheme for error correction with a redundancy of level one. Conceptually, the data stream is arranged as a series of pairs of data packets. The last data packet of each pair is repeated as the first data packet of the next pair. Symbolically, for each packet N, $N_{last} \rightarrow N_{fir}+1$. The first packet of the first pair is initialized with a null value to protect against loss of the first data packet. Level one redundancy translates this into duplicated data packet pairs of "ØT", "Th", "hi", "is", and so on.

FIG. 8(c) illustrates the error correction algorithm of the invention when the level of redundancy is level two. Here, data packets are arranged in triplets. The algorithm is constructed such that the last packet of the first triplet becomes the middle packet of the next triplet, and the middle packet of the first triplet becomes the first packet of the next triplet. Symbolically, $N_{mid} \rightarrow N_{fir}+2$, and $N_{last} \rightarrow N_{mid}+2$. As before, the packets are initialized with nulls to permit redundancy for the beginning packets in the data stream. Since the packets are in triplets, there must be nulls for the first two packets of the first triplet. Therefore, the data stream "This is a sentence." is replicated as "ØØT", "ØTh", "Thi", "his," et cetera. Each new triplet loses the first packet of the last triplet.

FIG. 8(d) illustrates the error correction scheme for redundancy of level three. Here, the data packets are arranged in quadruplets. The algorithm is constructed such that the second packet in the first quadruplet is mapped to the first packet in the second quadruplet; the third packet in the first quadruplet is mapped to the second packet in the second quadruplet; and the fourth packet in the first quadruplet is mapped to the third packet in the second quadruplet; the first packet in the first quadruplet is not repeated in the next quadruplet. Symbolically, $N_{sec} \rightarrow N_{fir}+3$; $N_{thr} \rightarrow N_{sec}+3$ and $N_{four} \rightarrow N_{thr}+3$. In order to prevent the loss of first three data packets, a series of nulls is added to the first three data packets. The first quadruplet is initiated with three nulls, and these nulls are transformed by the algorithm into two nulls in the second quadruplet and one null in the third quadruplet.

More generally, for a redundancy of level k, for k=0 to L, the algorithm provides that the $i^{th}$ data packet is repeated k times at positions $(i+k)_j$ for j=1 to k.

One important feature of the forward error correction algorithm of the invention is that the level of redundancy can be dynamically varied from packet to packet within a data stream. For example, one group of packets can have a level one redundancy, the next group of packets can have a level three redundancy, and the following group of packets can have a level three redundancy. Selecting the level of redundancy is one of the features performed by the voice port. Level three redundancy can sustain three consecutive packets losses by the Internet without the listener noticing a loss.

Instead of changing the packet redundancy, the voice port can also dynamically vary the packet size or bundling. The packet size may initially be 67 bytes, with 64 bytes of information and a 3 byte header. The packet bundling may be changing by bundling two 64 byte packets together with a 3 byte header to give a 131 byte packet. Or, the packet size could be changed from 64 bytes to 32 bytes of information to give a 35 byte packet, including a 3 byte header. Both the packet size and packet bundling can be changed by the voice port from packet to packet in the data stream to accommodate the loss characteristics of the Internet at that particular time.

Furthermore, not only does the voice port have the capability of dynamically changing the redundancy, packet size and packet bundling from packet to packet, but also the voice port can similarly vary the codec algorithm from packet to packet. The packet is given self-describing information about what type of codec is needed at the receiver to decompress the packet. The choice of codec at the transmitter may be derived from a complex function of choices of packet redundancy, packet size and packet bundling.

The voice port of the present invention can thus dynamically pick the speech compression algorithm, the data packet size, and the type of forward error correction to adapt to network conditions. A complex feedback algorithm dictates the various conditions under which the voice port adjusts these variables. The voice port can also select from several qualities of codec in response to possible conditions presented by the network.

Generally speaking, the voice port increases the packet redundancy when it detects a loss of information, and this implies that less information will be propagating in a given packet stream. To accommodate the same quantity of information through the limited bandwidth of a modem, the speech quality must be sacrificed. Therefore, a faster but lower speech quality codec algorithm is simultaneously implemented. The result is that the loss of data packets is compensated by the redundancy.

Speech compression is utilized to produce more compact representation of spoken sounds. The goal is that the reconstructed speech is perceived to be close to the original speech. The two main measures of this closeness are intelligibility and naturalness. The standard reference point is called "toll quality speech," which is the speech quality that is expected over a standard telephone line.

Figure 9:
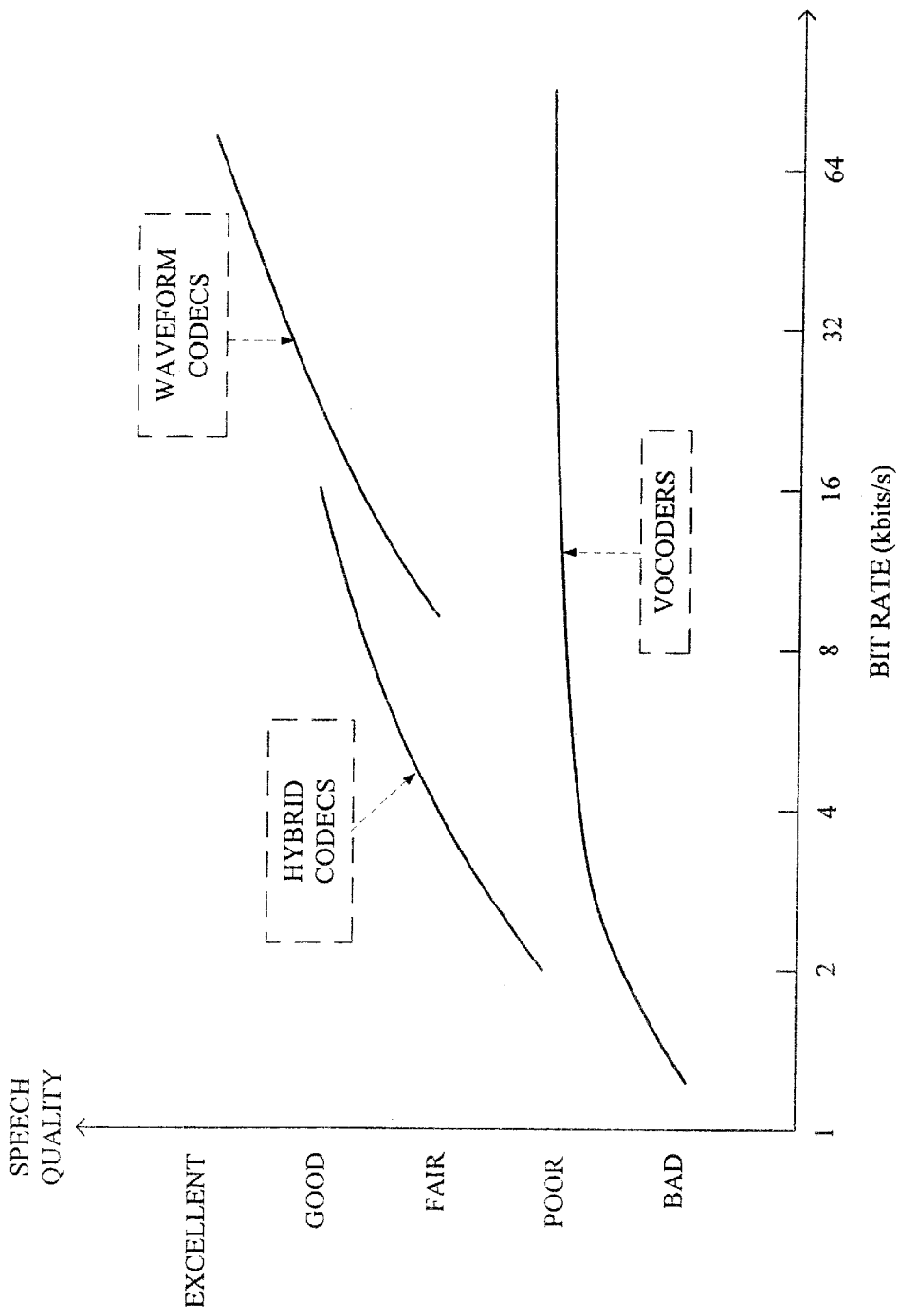
FIG. 9 is a graph showing speech quality for main classes of codecs.

As shown in FIG. 9, conventional speech coding techniques broadly fit within three classes: (1) waveform codecs, (2) source codecs, and (3) hybrid codecs. Waveform codecs operate at high bit rates and yield very good speech quality. Source codecs operate at very low bit rates and produce speech with a synthetic sound quality. Hybrid codecs use combinations of techniques from both source and waveform coding, and give good speech quality at intermediate bit rates.

Waveform codecs attempt to reconstruct the signal without including any knowledge or information about how the original signal is produced. Waveform codecs therefore also work well with non-speech sound signals. Generally, these codecs have low complexity and produce high quality speech at rates above 16 kbits/sec. The reconstructed speech quality degrades rapidly below this bit rate.

Pulse Code Modulation (PCM) is the simplest form of waveform coding. PCM involves sampling and quantizing the input waveform. Narrow-band speech is typically band-limited to 4 kHz and sampled at 8 kHz. With linear quantization, 12 bits per sample are required to obtain good quality speech, and this gives a bit rate of 96 kbits/sec. This bit rate may be reduced by using non-uniform quantization of samples. Particularly in speech coding, a logarithmic quantizer is often used.

One commonly used technique involves trying to predict a value of the next speech sample from a previous speech sample. Such predictive coding is possible because there are correlations due to the constant effects of the vocal tract and vocal chords in all speech samples. The error signal between the predicted samples and the actual sample has a low variance when the predictive coding is effective, and it is thereby possible to quantize this error signal with fewer bits than a complete original speech signal. Differential Pulse Code Modulation (DPCM) is an example of predictive coding.

As a further refinement, the predictor and quantizer are adaptive so that they change in time to match the characteristics of the speech being coded. Such Adaptive Differential PCM (ADPCM) codecs operating at 32 kbits/sec give a speech quality similar to 64 kbits/sec PCM codecs.

Waveform codecs produce speech coding either in the time or frequency domains. In Sub-Band Coding (SBC), the input speech is split into a number of frequency bands, called 'sub-bands,' and each band is coded individually using, for example, a ADPCM coder. Each of the bands is then individually decoded and the plurality of bands are recombined to reconstruct the speech signal at the receiver. SBC has advantages because the noise in each sub-band is dependent only on the coding in that sub-band. Therefore, a greater number of bits are allocated to the most perceptually important sub-bands so that noise in these frequency bands is low, while a fewer number of bits are allocated to other less perceptually important sub-bands so that noise in these bands is higher. Sub-band Coding schemes produce toll quality speech communication in the range of 16–32 kbits/sec. The filtering required to split the speech signals into sub-bands makes SBC more complex than DPCM, and correspondingly produces more delay, but the delay and complexity are still much less than that of hybrid coding.

Another type of frequency domain waveform coding is Adaptive Transform Coding (ATC). This technique uses a fast mathematical transform (e.g. discrete cosine transforms) to split blocks of speech into a large number of frequency bands. The number of bits used to code each transform coefficient is adapted depending upon the spectral properties of the speech. Toll quality reproduced speech is achieved with bit rates as low as 16 kbits/ sec with ATC.

In contrast to waveform coders, source coders possess information about how the signal is produced. Source coders generate a model of the source of the signal, and extract parameters of the model from the signal. The model parameters are given to the decoder.

Source coders for speech are called 'vocoders.' First, the vocal tract is represented as a time-varying filter and is excited with a white noise source for unvoiced segments, or by a train of pulses separated by a pitch period for voiced segments. Parameters sent to the decoder include a filter specification, a voiced/unvoiced flag, the variance of the excitation signal and the pitch period of the voiced speech. These parameters are updated every 10–20 milliseconds. The model parameters are determined in the encoder either in the time or frequency domains.

Vocoders operate at 2.4 kbits/sec or below, and produce speech reproduction that is intelligible but not natural sounding. Therefore, vocoders are mainly applicable for military uses where natural sound is not important and the speech is encrypted. The simple source coder model of speech reproduction does not make increasing the bit rate worthwhile.

Hybrid codecs attempt to bridge the gap in the range of 2.4 kbits/sec to 16 kbits/sec between waveform and source codecs. The most common hybrid codec is Analysis-by-Synthesis (AbS). The "Analysis-by-Synthesis" designation means that the encoder analyzes the input speech by synthesizing many approximations to it. This codec uses the same linear predictive filter model of the vocal tract as LPC vocoders, but employs excitation signals to match the reconstructed speech waveform to the original speech waveform. AbS codecs include the Multi-Pulse Excited (MPE) codec, the Regular-Pulse Excited (RPE) codec, and the Code-Excited Linear Predictive (CELP) codec. The pan-European GSM mobile telephone system uses a simplified RPE codec with long-term prediction, operating at 13 kbits/sec to provide toll quality speech.

Figure 10:
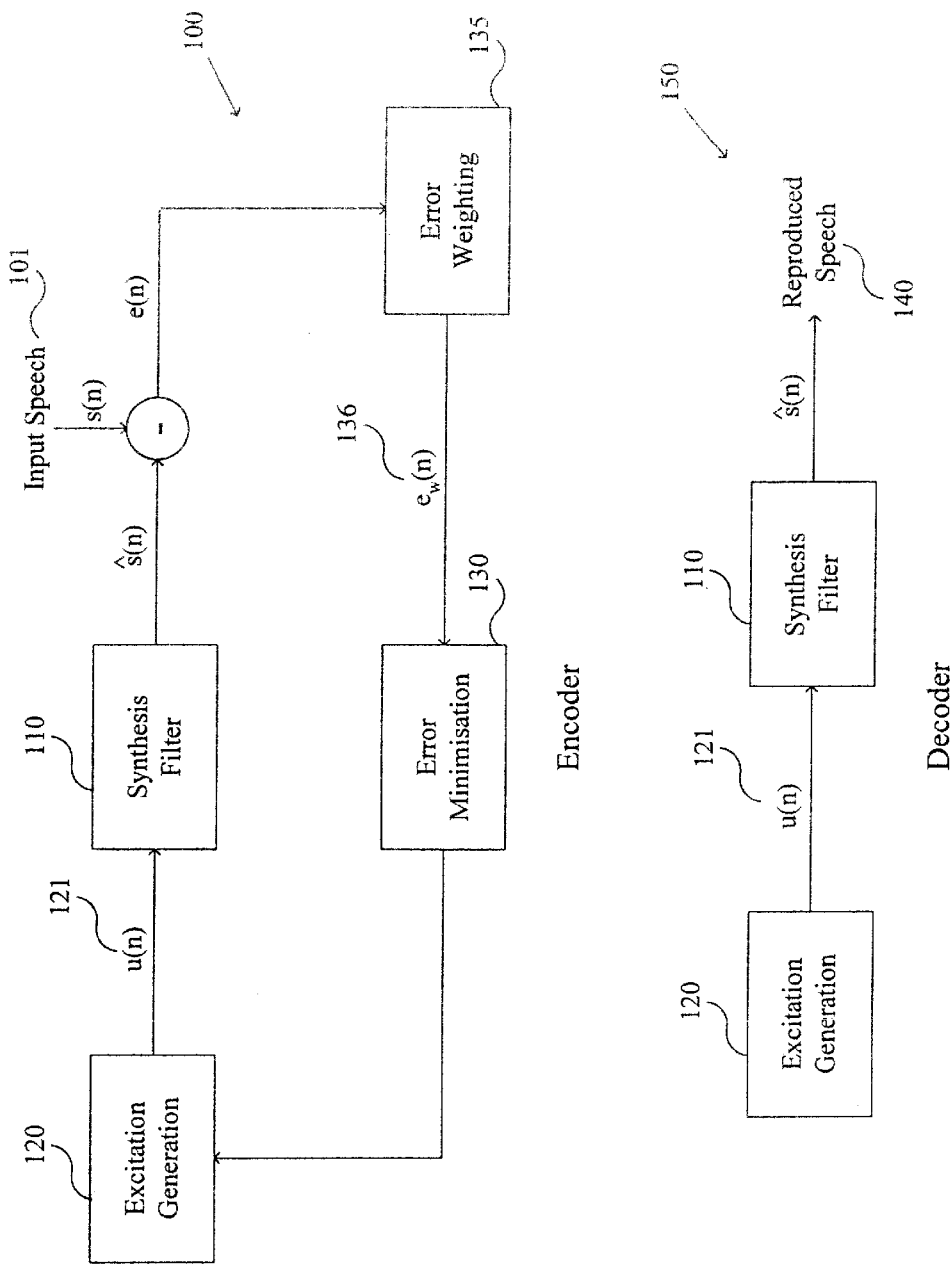
FIG. 10 is a block diagram of an AbS codec model.

The basic AbS model of coders 100 and decoders 150 is shown in FIG. 10. AbS codecs begin by splitting the input speech signal s(n) 101 into coded frames that are about 20 milliseconds long. Parameters are then determined for a synthesis filter 110 belonging to each frame, and an excitation signal 121 is determined for this filter 110. The synthesis filter 110 is designed to model correlation introduced into the speech by the vocal tract. The excitation signal u(n) 121 is defined to minimize the error between the input 101 and reconstructed speech 140 when the excitation signal u(n) 121 is passed into the synthesis filter 110. Encoder 100 transmits information representing the synthesis filter 110 analysis parameters and the excitation signal u(n) 121 to the decoder for each frame; the corresponding excitation signal u(n) 121 is passed through the synthesis filter 110 at the decoder 150 to obtain the reconstructed speech $\bar{s}$(n) 140.

Generally, the synthesis filter 110 is an all-pole, short-term, linear filter of the form:

$$H(z)=1/A(z)$$

where $$A(z) = 1 - \sum_{i=1}^{p} a_i z^{-1}$$

is the predictive error filter determined by minimizing the energy of the residual signal produced when the original speech segment is passed through it. p is of order 10.

Furthermore, the synthesizer sometimes includes a pitch filter to model the long-term periodicities in the voiced speech. These long-term periodicities are also exploited by including an adaptive cookbook in the excitation generator so an excitation signal u(n) includes a component Gu(n$_{-a}$), where a is the estimated pitch period. MPE and RPE filters generally operate without a pitch filter, although a pitch filter improves performance. However, a pitch filter is very important for CELP codecs.

Error weighting block 135 shapes the spectrum of error signal e$_w$(n) 136 in order to reduce subjective error loudness by utilizing the fact that error signal e$_w$(n) is partially masked by high energy speech. This weighting produces a significant improvement in the subjective quality of the reconstructed speech for AbS codecs.

The dynamic speech codec selection in the voice port of the present invention is distinguishable from prior art codec selection techniques. The present codec selection is not 'adaptive' in the sense of ADPCM where a parameter such as the predictor and/or quantizer is "adapted" to match the speech segment characteristics within a single codec. More complexity and mathematical sophistication is required to adapt the codec than to change to another codec entirely. Neither is the dynamic characteristic of the present invention concerned with classifying speech segments in the time domain and then applying differential coding to each segment as in CELP; an entirely different type of codec is applied between speech segments in the instant device.

The present invention is furthermore distinct from a device where the codec is manually selected by the users. While a given internet telephone system optionally may include a plurality of codec types that are selected from a menu, as in Chen et al, supra, these systems do not automatically and dynamically change the codec on a packet-to-packet basis in response to system-detected changes in voice quality. In the prior art system of Chen et al, the user must manually select one or the other of the codecs from a menu, and the codec type does not automatically change from one speech segment to another speech segment in the same conversation. While any given codec often contains an adaptive feature that changes a parameter, the given codec type itself remains a constant.

Most codecs in use for internet telephone systems involve hybrid codecs such as GSM (Global System for Mobile Communications), which uses Regular Pulse Excited (RPE) codec. In RPE, the input speech is segmented into 20 millisecond frames, and a set of eight short term predictor coefficients are found for each frame. Each frame is further split into four 5 millisecond sub-frames, and the encoder finds a delay and gain for the codec's long term predictor for each sub-frame. The residual signal for both the short and long term filtering of each sub-frame is quantized. The level of sophistication of other commercially available hybrid codec algorithms is comparable to GSM.

Voxware codec (of Voxware, Inc., Princeton, N.J.) is commercially available in a number of varieties, including the VR (variable rate), RT (real time) and SC (scalable). The VR codecs classify individual speech frames into one of four classes: silence, unvoiced, mixed voicing and fully voiced, and each of these classes uses a different scheme for speech parameter transmission.

Figure 11:
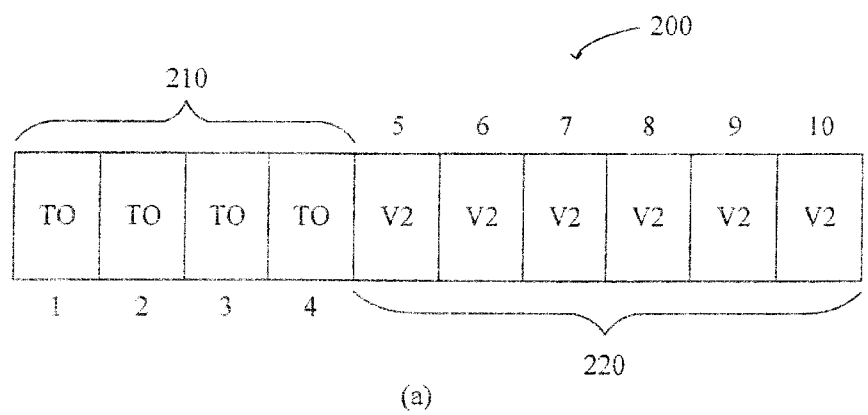
FIGS. 11(a) to (c) illustrate how the voice port changes the codec and redundancy to maintain speech quality.
Figure 11:
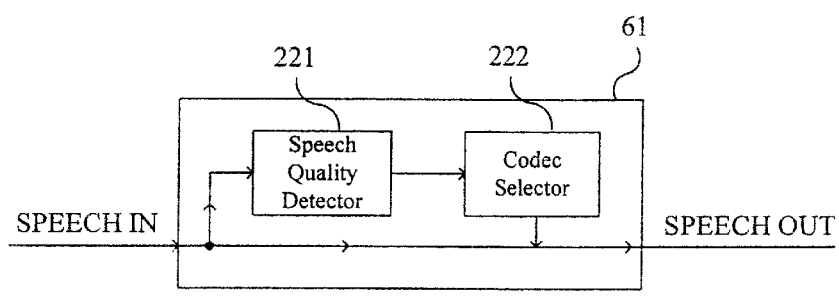
Figure 11:
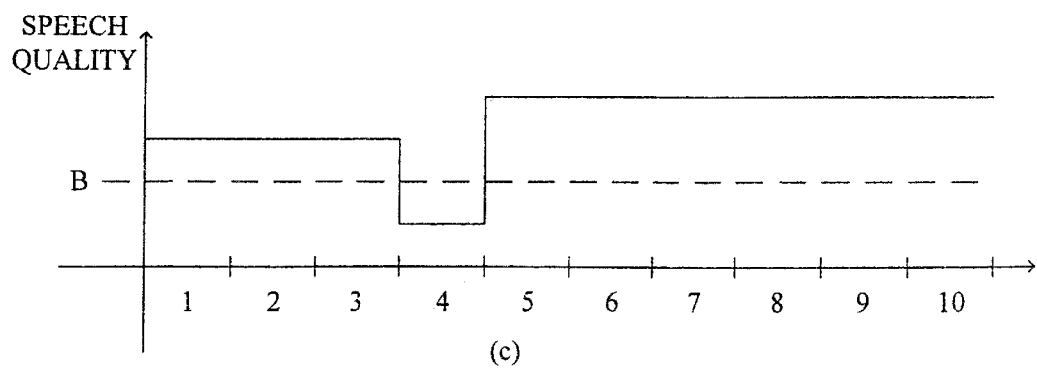

A concrete example is shown in FIG. 11(*a*). Assume the voice port begins with the commercially available TrueSpeech codec algorithm (of DSP Group, Santa Clara, Calif.), which encodes speech at 8.5 kbits/ second and with no redundancy. A stream of voice data 200 includes a plurality of data packets numbered 1 through 10, where each packet further contains a plurality of data bytes indicated by the letters in FIGS. 8(*a*) to (*d*). A plurality of packets 210 (i.e. packets 1 through 4) in the stream 200 of voice data are illustrated to have a format T0, where "T" designates TrueSpeech and "0" indicates the level of redundancy. After noticing dropped packets, the voice port adjusts by selecting the Voxware 2.9 kbit/second algorithm having somewhat lower sound quality, but with two level redundancy error correction. Level two redundancy Voxware includes two 2.9 kbits/second algorithms, which is still approximately 6 kbits/second. These are illustrated as another plurality of packets 220 (i.e. packets 5 through 10) labelled with the format V2, where "V" represents a particular type of Voxware codec and "2" is the level of redundancy. Thus, it is possible to change the redundancy and the codec to correct for dropped packets and utilize the same amount of Internet bandwidth. Fault tolerance in the voice transmission data is thereby achieved.

FIGS. 11(b) and (c) show how the voice port 61 performs a codec selection on the voice data stream 200 of FIG. 11(a) to maintain speech quality. Voice port 61 has speech quality detector 221 and codec selector 222 modules. A first speech packet (packet #1 in FIG. 11(a)) enters voice port 61, and speech quality of this packet is detected by speech quality detector 221. The quality of packet #1 is determined to be acceptable by the speech quality detector module 221 since it is above the baseline B in FIG. 11(c). Accordingly, codec selector module 222 maintains the codec and redundancy as "T0" for packet #2. This continues until speech quality detector 221 determines that the speech quality of packet #4 is unacceptable; the speech quality falls below baseline B due to changing network conditions. Codec selector 222 responsively changes both the codec and the redundancy for packet #5 to "V2." FIG. 11(c) shows that level two redundancy Voxware for packets #5 through #10 produces an acceptable speech quality. Thus, voice port 61 responds to changing network conditions to maintain speech quality.

It is also possible to vary the size of the individual packets or to vary the bundling-of the packets by techniques that are well known in the art. The voice port therefore tolerates faults in the data stream, while the standard procedure for Transmission Control Protocol (TCP) on the Internet is to request a retransmission of the data.

Another important characteristic of the voice port is that it permits codec encapsulation so that the higher level software is functionally independent of the lower level codec software. The codecs are therefore essentially objects and neither the transport nor any of the other software needs to be compatible with any particular codec. As new codecs are introduced, they can be added easily added without requiring modifications in the higher level system software.

An alternative embodiment of the invention adjusts for dead time in a speech message by time warping the speech at a constant pitch. Generally, once the integrity of the data stream is guaranteed by the error correction algorithm, at least part of the data stream waits in a buffer on the receiving side of the server until it is emptied to the receiver. However, when there is no data left in the buffer, there is a danger that dead air time can occur, in which the listener hears a gap or blank in the transmission. Therefore, the software further contains a utility that senses when the data buffer becomes depleted, and stretches the data reaching the ear of the listener in a manner opposite to the technique utilized in television commercials and radio voiceovers to speed up the data rate. Effectively, the algorithm contains a lever that measures the number of packets in the buffer, and, without changing pitch, speeds up or slows down the data rate without changing pitch corresponding to the pool depth. The Voxware codec particularly supports this algorithm to specify the degree of time warp.

Figure 12:
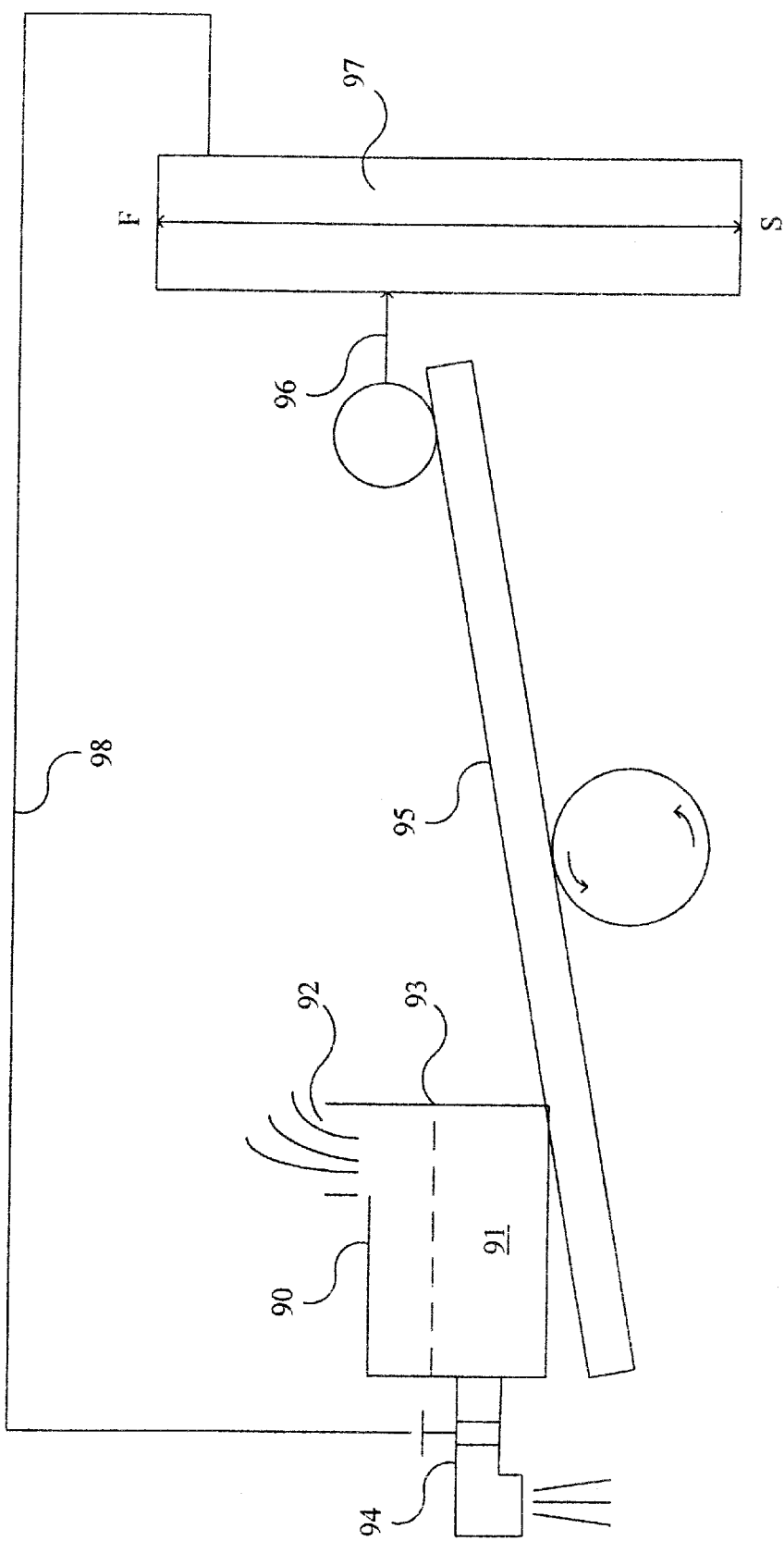
FIG. 12 illustrates conceptually the operation of the time warping speech algorithm.

FIG. 12 illustrates conceptually how the time warping speech algorithm is implemented. Buffer 90 contains voice data 91 from a data stream 92 of an incoming call indicated by a level 93 inside buffer 90. This voice data 91 is draining through a faucet 94 from buffer 90 to the receiver. Buffer 90 is shown to be on a seesaw scale 95 so that when buffer 90 is full of voice data 91, arrow 96 on the other end of seesaw 95 is high; when buffer 90 is nearly empty of voice data 91, arrow 96 is low. Arrow 96 points to a scale 97 sliding between fast (F) and slow (S). Output from sliding scale 97 goes to feedback loop 98 controlling faucet 94. Thus, arrow 96 points toward F when the buffer level 93 is full, and feedback loop 98 increases the rate at which the voice data 91 is draining through faucet 94 from buffer 90; when buffer level 93 is nearly empty of voice data 91, arrow 96 points towards S and the feedback loop 98 makes the voice data drain more slowly through faucet 94. Simultaneously, the algorithm maintains a pitch for the voice data 91 that is constant and independent of the rate of draining of the buffer 90.

The invention has been described in general terms according to the preferred embodiments. However, those of ordinary skill in the art will understand that certain modifications or changes may be made to the disclosed embodiment without departing from the essential nature of the invention. Therefore, the scope of the invention is to be limited only by the following claims.

We claim:

1. A software method of choosing from a plurality of codecs in an Internet telephone system, said method comprising the steps of:

receiving a plurality of self-describing data packets in a voice data stream on a receiving end;

acquiring a voice quality measurement from said self-describing data packets received at said receiving end; and dynamically changing codec algorithms in response to said voice quality measurement on a packet-to-packet basis for each packet in said plurality of self-describing data packets for optimizing the voice quality of the information contained in each said packet.

2. The software method of claim 1, further comprising:

varying the length of said packets.

3. The software method of claim 1, further comprising:

applying data redundancy to said packets.

4. The software method of claim 1, further comprising:

varying the bundling of said packets.

5. The software method of claim 1, further comprising the steps of:

detecting a quantity of voice data waiting in a voice input buffer;

regulating the rate of removal of said voice data from said buffer based upon said quantity from a first speed to a second speed; and maintaining a constant pitch for said voice data as heard by a caller as the rate changes from said first speed to said second speed.

6. The software method of claim 5, wherein said regulating step further comprises:

slowing down the rate of removal of said voice data for low quantities; and speeding up the rate of removal for high quantities.

7. A software method of choosing from a plurality of codecs in an Internet telephone system, said method comprising the steps of:

sending a plurality of self-describing data packets in a voice data stream on a sending end;

acquiring a voice quality measurement from said self-describing data packets received at a receiving end; and dynamically changing codec algorithms in response to said voice quality measurement on a packet-to-packet basis for each packet in said plurality of self-describing data packets for optimizing the voice quality of the information contained in each said packet.

8. The software method of claim 7, further comprising:

varying the length of said packets.

9. The software method of claim 7, further comprising:

applying data redundancy of said packets.

10. The software method of claim 7, further comprising:

varying the bundling of said data packets.

11. A software system for choosing from a plurality of codecs in an Internet telephone system, comprising:

a gateway server for receiving a plurality of self-describing data packets in a voice data stream on a receiving end; and a voice port in said gateway server for acquiring a voice quality measurement from said self-describing data packets received by said gateway server, and dynamically changing codec algorithms in response to said voice quality measurement on a packet-to-packet basis for each packet in said plurality of self-describing data packets for optimizing the voice quality of the information contained in each said packet.

12. The software system of claim 11, wherein:

said voice port varies the length of said packets.

13. The software system of claim 11, wherein:

said voice port applies data redundancy to said packets.

14. The software system of claim 11, wherein:

said voice port varies the bundling of said packets.

15. The software system of claim 11, further comprising:

a software utility for detecting a quantity of voice data waiting in a voice input buffer;

said utility regulates the rate of removal of said voice data from said buffer based upon said quantity from a first speed to a second speed; and said utility maintains a constant pitch for said voice data as heard by a caller as the rate changes from said first speed to said second speed.

16. The software system of claim 15, wherein:

said utility slows down the rate of removal of said voice data for low quantities of said data in said buffer and speeds up the rate of removal for high quantities.

17. A software system for choosing from a plurality of codecs in an Internet telephone system, comprising:

a gateway server for receiving a plurality of self-describing data packets in a voice data stream on a receiving end; and a voice port in said gateway server for acquiring a voice quality measurement from said self-describing data packets received by said gateway server, comparing said voice quality measurement to a numerical baseline, and dynamically changing codec algorithms in response to said comparison of said voice quality measurement to said numerical baseline on a packet-to-packet basis for each packet in said plurality of self-describing data packets for optimizing the voice quality of the information contained in each said packet.

18. The software system of claim 17, wherein:

said voice port varies the length of said packets.

19. The software system of claim 17, wherein:

said voice port applies data redundancy to said packets.

20. The software system of claim 17, wherein:

said voice port varies the bundling of said packets.

21. The software system of claim 17, wherein said codec algorithm is changed if said voice quality measurement is less than said numerical baseline and said codec algorithm is not changed if said measurement is greater than or equal to said numerical baseline.

22. The software system of claim 17, wherein said codec algorithm is changed if said voice quality measurement is greater than or equal to said numerical baseline and said codec algorithm is not changed if said voice quality measurement is less than said baseline.

23. A software system for choosing from a plurality of codecs in an Internet telephone system, comprising:

means for receiving a plurality of self-describing data packets in a voice data stream on a receiving end;

means for acquiring a voice quality measurement from said self-describing data packets received at said receiving end;

means for comparing said voice quality measurement to a numerical baseline; and means for dynamically changing codec algorithms in response to said comparison of said voice quality measurement to said numerical baseline on a packet-to-packet basis for each packet in said plurality of self-describing packets for optimizing the voice quality of the information contained in each said packet.

24. The software system of claim 23, further comprising:

means for dynamically varying the length of said packets.

25. The software system of claim 23, further comprising:

means for applying data redundancy to said packets.

26. The software system of claim 23, further comprising:

means for varying the bundling of said packets.

* * * * *